March 26, 1968 N. MOTTA 3,375,455

SYMMETRICAL AMPLIFIER WITHOUT DC SHIFT BETWEEN INPUT AND OUTPUT

Filed Oct. 20, 1964

INVENTOR
NATHANIEL MOTTA
BY Samuel Lindenberg
ATTORNEY

United States Patent Office 3,375,455
Patented Mar. 26, 1968

3,375,455
SYMMETRICAL AMPLIFIER WITHOUT DC SHIFT BETWEEN INPUT AND OUTPUT
Nathaniel Motta, Pasadena, Calif., assignor to California Institute Research Foundation, Pasadena, Calif., a corporation of California
Filed Oct. 20, 1964, Ser. No. 405,040
7 Claims. (Cl. 330—13)

ABSTRACT OF THE DISCLOSURE

A transistor amplifier is provided which is suitable for multi-stage utilization and includes two opposite impurity type transistors, with their collectors connected together and their emitters coupled to opposite sides of a center tap power supply. Output is taken from the collectors and the center tap of the power supply. The bases are biased by either diodes for low level inputs or zener diodes for high level inputs. Input is applied between the center point of the diodes and the center tap of the power supply.

This invention relates to electronic amplifiers and more particularly to improvements therein.

An object of this invention is the provision of a novel amplifier wherein the DC level of the input signal is preserved in the output signal.

Another object of this invention is the provision of an amplifier which can be used for multistage construction wherein direct interstage coupling is afforded without zero offset.

Another object of this invention is the provision of an amplifier which can be used to obtain a predetermined shift, in either direction, of the DC level between input and output.

Still another object of the present invention is to provide a novel, unique and useful transistor amplifier.

These and other objects of this invention may be achieved in an arrangement wherein two opposite impurity type transistors have their collectors connected together and their emitters connected through resistors to opposite sides of a center tapped power supply. Output is taken from the center tap of the power supply and the collectors. Means are provided for biasing the bases of these transistors so that the DC voltage at the input remains relatively the same with respect to the voltage on the collectors or output. These means can be diodes for low level inputs to the amplifier or zener diodes for high level inputs to the amplifier. These are connected between the bases of the two transistors and the bases are connected to the power supply through suitable resistors. Input is applied between the center point of the diodes (zener or ordinary) and the center tap of the power supply.

The novel features that are considered characteristic of this invention are set forth with particularity in the appended claims. The invention itself both as to its organization and method of operation, as well as additional objects and advantages thereof, will best be understood from the following description when read in connection with the accompanying drawings, in which:

Figure 1:
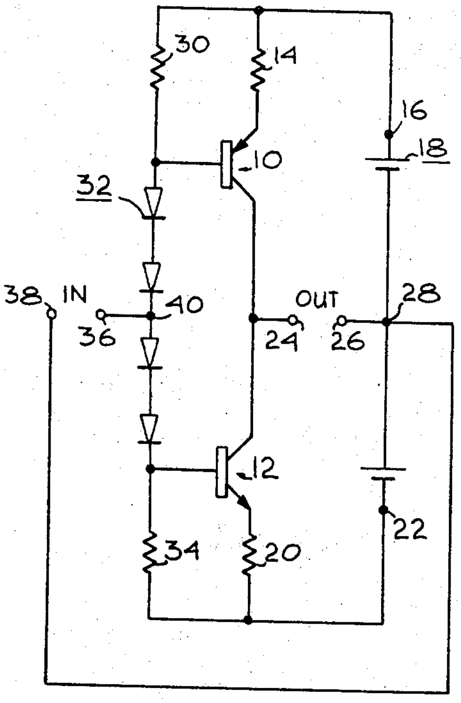
FIGURE 1 is a circuit diagram showing a low level amplifier stage in accordance with this invention.

As shown in FIGURE 1, an amplifier in accordance with this invention will comprise two transistors, respectively 10, 12 of opposite impurity type. The transistor 10 is the PNP transistor and has its emitter connected through a resistor 14 to the positive terminal 16 of a center tap potential source 18. The NPN transistor 12 has its emitter connected through a resistor 20 to the negative terminal 22 of the operating potential source 18. The collectors of the two transistors are connected together and output terminals respectively 24, 26 are connected to the collectors and to the center tap 28 of the power supply 18.

The base of transistor 10 is connected to the positive terminal 16 by resistor 30. The base of transistor 12 is returned to the negative terminal 22 through resistor 34. A diode string 32 connects the base of transistor 10 to the base of transistor 12. Quiescent bias for transistor 10 is obtained by the potential existing at the junction of resistor 30 and diode string 32. Similarly, bias for transistor 12 is obtained by the potential at the junction of diode string 32 and resistor 34. Resistor 30, diode string 32 and resistor 34 may be considered as a voltage divider across the source of operating potential 18 in which a fixed difference in potential is maintained between the bases of transistors 10 and 12. Input terminals respectively 36, 38 are connected to the center tap 40 of the diode string and also to the center tap 28 of the source of operating potential.

If we assume that the amplifier is completely and identically symmetrical, then the voltage drop across resistor 30 and that portion of the diode string 32 between input terminal 36 and the base of transistor 10 will be identical to that existing across resistor 34 and that portion of the diode string 32 between input terminal 36 and the base of transistor 12. Identical voltage drops will also exist across resistors 14 and 20 and transistors 10 and 12 (collector to emitter). Now since the common input and output terminals 38 and 26 are connected to the center tap of the source of potential 28 and the other input and output terminals 36 and 24 are at a potential exactly one-half way between that existing at the positive terminal 16 and the negative terminal 22 of the source of potential 18 then no difference in potential can exist between input terminal 36 and output terminal 24, nor can there be any residual DC between input terminals 36 and 38 or output terminals 24 and 26. Since in a practical circuit perfection is not possible, means may be provided such as adjustment of the value of any or all of resistors 14, 20, 30 and 34 to obtain the degree of symmetry which is desired.

Bias on the transistors in this amplifier will as in other amplifiers determine the operating class (A, AB1, etc.). If we assume Class A operation for the purpose of analysis, then the following occurs with the application of a positive going signal at the input terminals 36 and 38.

(1) Since the voltage drop across the diode string 32 is constant, the unattenuated signal will appear with equal amplitude at the bases of transistors 10 and 12.

(2) The signal applied to the base of transistor 10 will produce a decrease in current flow between its emitter and collector terminals. This change in current causes an excursion of the collector terminal in a negative direction.

(3) The same signal applied to the base of transistor 12 produces an increase in current through its collector to emitter terminals. This also produces a negative excursion at its collector terminal.

(4) Since the collectors of transistors 10 and 12 are connected together and both excursions are in the same direction, they aid each other and high amplification results.

The output terminals 24, 26 may be connected directly to a succeeding amplifier having the same configuration as the embodiment of the invention shown in FIGURE 1, or may be connected to any other desired type of amplifier.

The arrangement of the invention shown in FIGURE 1 which uses forward biased diodes for biasing the transistors is an arrangement most adaptable, in the case of linear amplifiers, to low level stages since, as the amplitude of the input signal increases, it will be appreciated that it will soon reach a level at which nonlinearity begins to occur. Further increase in signal will drive the transistors from cut off to saturation thus producing a squaring amplifier. If linear amplification of larger input signals is required, an increase in the source of potential and bias must be provided. The increase in bias may be accomplished by increasing the number of diodes in diode string 32 in FIGURE 1 or by using batteries in place of the diodes or, as shown in FIGURE 2, by connecting zener diodes 42, 44 in place of the diode string 32.

Figure 2:
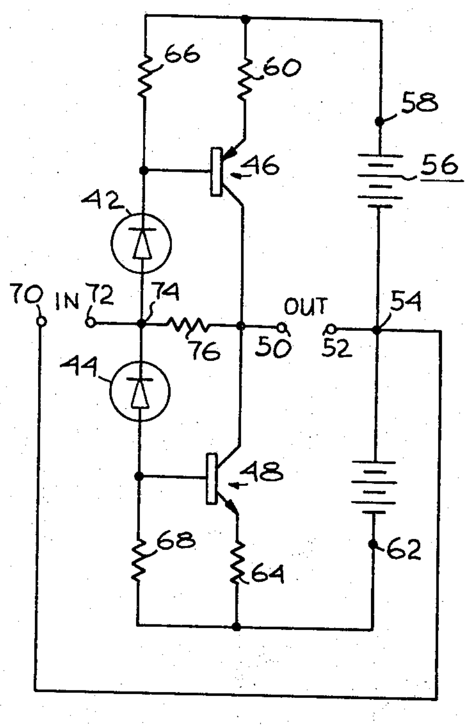
FIGURE 2 is a circuit diagram showing a high level amplifier stage in accordance with this invention.

The circuit arrangement shown in FIGURE 2 is substantially identical as that shown in FIGURE 1, and the operation of the circuit is substantially identical, with the exception that the circuit can handle higher level signals than the arrangement shown in FIGURE 1. As before, two opposite impurity type transistors respectively 46, 48 have their collectors connected together and to a common output terminal 50. The other output terminal 52 is connected to the center tap 54 of a power supply 56. The positive terminal 58 of the power supply is connected through a resistor 60 to the emitter of transistor 46. The negative terminal 62 of the power supply 56 is connected through a resistor 64 to the emitter of the NPN transistor 48.

A series arrangement of resistor 66, zener diodes 42 and 44 and resistor 68 is connected between the positive terminal 58 and negative terminal 62 respectively of the power supply 54. The base of transistor 46 is connected to the junction of resistor 66 and zener diode 42. The base of transistor 48 is connected to the junction of zener diode 44 and resistor 68. Bias for the two transistors is provided by the potential existing at the points to which the bases of the two transistors are connected. The EMF provided by the power supply 56 is large enough to maintain a current flow through zener diodes 42 and 44 in the reverse direction or break down region of operation. Input terminal 72 is connected to the center tap 74 between the two zener diodes 42, 44. If feedback is desired, this may be provided in one form by a resistor 76, which is connected between the collectors and the center tap connection 74.

Figure 3:
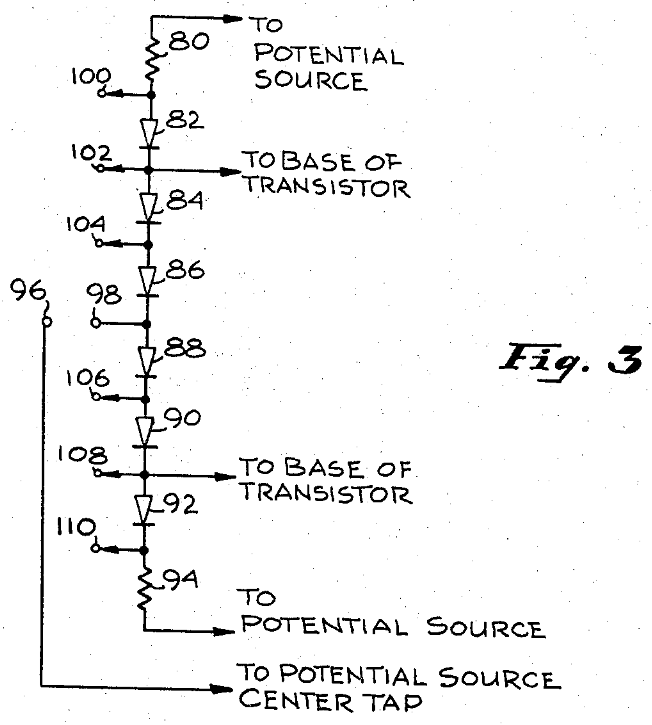
FIGURE 3 is a circuit diagram showing how the input to the amplifier can be varied to obtain a predetermined shift in DC level between input and output.

FIGURE 3 is a circuit diagram showing, in accordance with this invention only, the input section of the amplifier, which can be seen to be substantially the same as in FIGURE 1. A biasing arrangement for the bases of the two transistors includes the series connected resistor 80, diodes 82 through 92, and resistor 94. These are connected across the source of operating potential. The common input output terminal 96 is shown as well as the input terminal 98, connected to the center of the series connected diode resistor string.

Now, should it be desired to have a predetermined shift in the DC level between the input and output terminals of the amplifier, the input signal may be applied between the common input output terminal 96 and to one of the input terminals 102, 104, 106, 108, connected to one of the junctions between the diodes, or directly to the base of either transistor. A still larger offset in DC level between input and output is obtained by inserting an additional diode 82, or diodes between resistor 80 and the remaining diodes and/or an additional diode 92, or diodes between the remaining diodes and resistor 94. In this case, the bases of the transistors remain connected as shown in FIGURE 1, and the input signal is applied between the common terminal 96 and the terminal 100, or between the common terminal 96 and the terminal 110.

There has accordingly been described and shown hereinabove a novel, useful and simple amplifier arrangement which enables direct connection between amplifier stages and wherein there is no DC level shift between the input and the output signals; or if the application requires it, a predetermined shift in DC level in either direction between input and output terminals.

What is claimed is:

1. An amplifier comprising a first and second transistor each having emitter, collector and base electrodes, said first transistor being an NPN transistor and said second transistor being a PNP transistor, a source of operating potential having a first and a second power terminal and a center tap connected to a point of potential centered therebetween, first resistance means connecting said first power terminal to the emitter of said first transistor, second resistance means connecting said second power terminal to the emitter of said second transistor, said first and second resistance means having substantially equal values, a first output terminal connected to said center tap, a second output terminal connected to the collectors of the first and second transistors, a first input terminal connected to said center tap, means for biasing the bases of said first and second transistors consisting of a plurality of diodes connected in series between the bases of said first and second transistors, and third and fourth substantially equal valued resistance means respectively connecting the bases of said first and second transistors to said respective first and second power terminals, a second input terminal and means connecting said second input terminal to a center point in said plurality of diodes whereby said amplifier is symmetrically balanced and without DC shift between input and output.

2. An amplifier as recited in claim 1 wherein said plurality of diodes are zener diodes, and a resistor is connected between said second output terminal and a center point between said plurality of zener diodes.

3. An amplifier as recited in claim 1 wherein said means connecting said second input terminal to said means for biasing the bases comprises a direct connection between said second input terminal and between two of said plurality of said series connected diodes.

4. An amplifier as recited in claim 1 wherein said means connecting said means for biasing the bases between said first and second power terminals includes a first series connected resistor and diode connected between the base of said first transistor and said first power output terminal, and second series connected resistor and diode connected between the base of said second transistor and said second power output terminal.

5. An amplifier comprising a first and second transistor each having emitter collector and base electrodes, said first transistor being of the NPN type and said second transistor being of the PNP type, a source of operating potential having a first and second power terminal and a center tap, a first resistor connected between the emitter of said first transistor and said first power terminal, a second resistor connected between the emitter of said second transistor and said second power terminal, a first amplifier output terminal connected to the collectors of said first and second transistors, a second amplifier output terminal connected to said center tap, a first bias resistor, means connecting said first bias resistor between said first power terminal and the base of said first transistor, a second bias resistor, means connecting said second bias resistor between the second power terminal and the base of said second transistor, a plurality of series connected diodes connected between the bases of said first and second transistors, a first input terminal connected to the center tap of said operating potential supply, and a second input terminal connected to a predetermined location on said plurality of series connected diodes.

6. An amplifier as recited in claim 5 wherein said plurality of diodes comprises a first and a second zener diode connected in series and said second input terminal is connected between said first and second zener diodes.

7. An amplifier as recited in claim 5 wherein said means connecting said first bias resistor between the first power output terminal and the base of said first transistor is a first diode, and said means connecting said second bias resistor between the second power output terminal and the base of said second transistor is a second diode.

References Cited

UNITED STATES PATENTS 2,860,193 11/1958 Lindsay ----------- 179—171

FOREIGN PATENTS 1,146,110 3/1963 Germany.

ROY LAKE, *Primary Examiner.*

E. C. FOLSOM, *Assistant Examiner.*